US007367001B2

(12) United States Patent
Baumgartner et al.

(10) Patent No.: US 7,367,001 B2
(45) Date of Patent: Apr. 29, 2008

(54) METHOD, SYSTEM AND COMPUTER PROGRAM PRODUCT FOR VERIFICATION OF DIGITAL DESIGNS USING CASE-SPLITTING VIA CONSTRAINED INTERNAL SIGNALS

(75) Inventors: Jason Raymond Baumgartner, Austin, TX (US); Christian Jacobi, Boblingen (DE); Viresh Paruthi, Austin, TX (US); Kai Oliver Weber, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 337 days.

(21) Appl. No.: 11/002,525

(22) Filed: Dec. 2, 2004

(65) Prior Publication Data

US 2006/0122817 A1    Jun. 8, 2006

(51) Int. Cl.
*G06F 17/50* (2006.01)
*G06F 9/45* (2006.01)
(52) U.S. Cl. .................. 716/5; 716/4; 716/6
(58) Field of Classification Search ............... 716/3–6, 716/18; 703/13, 14, 22; 702/108, 117
See application file for complete search history.

(56) References Cited

U.S. PATENT DOCUMENTS 5,729,554 A * 3/1998 Weir et al. ............ 714/739
5,831,991 A * 11/1998 Miller et al. .......... 714/724
5,845,064 A * 12/1998 Huggins .................. 714/33
5,875,196 A * 2/1999 Chakradhar et al. ..... 714/724
6,141,630 A * 10/2000 McNamara et al. ....... 703/14
6,530,054 B2 * 3/2003 Hollander ............... 714/739
6,539,345 B1 * 3/2003 Jones et al. ............. 703/15
6,885,983 B1 * 4/2005 Ho et al. ................ 703/14
6,944,848 B2 * 9/2005 Hartman et al. ......... 717/124
7,073,143 B1 * 7/2006 Huang ..................... 716/5

OTHER PUBLICATIONS

Berg et al., Formal Verification of the VAMP Floating Point Unit, 2001, CHARME, p. 325-339.*
Aagaard et al., Formal Verification using parametric representations of Boolean Constraints, 1999, ACM, pages.*
Chen, Y.A. & Bryant R. "Computer Aided Verification", Conference, Jun. 2-Jul. 2, 1998, 8 pp., vol. 1427, ISBN 3-540-64608-6, USA.

* cited by examiner

*Primary Examiner*—Jack Chiang
*Assistant Examiner*—Nghia M. Doan
(74) *Attorney, Agent, or Firm*—Casimer K. Salys; Dillon & Yudell LLP

(57) ABSTRACT

A method of verifying a digital design is disclosed. The method comprises generating a reference model for a first digital design and creating an operational model for a second digital design, wherein the first digital design and the second digital design are intended to have a same logical function. A plurality of testcase types are then created by constraining one or more internal signals, and one or more test scripts representing the plurality of testcase types are produced. The method also includes verifying the second digital design with a testing simulation program by comparing results of the test scripts from the operational model and the reference model.

6 Claims, 6 Drawing Sheets

METHOD, SYSTEM AND COMPUTER PROGRAM PRODUCT FOR VERIFICATION OF DIGITAL DESIGNS USING CASE-SPLITTING VIA CONSTRAINED INTERNAL SIGNALS

BACKGROUND OF THE INVENTION

1. Technical Field

The present invention relates in general to testing and verification, and in particular to verification of digital designs. Still more particularly, the present invention relates to a system, method and computer program product for verification of digital designs via comparison of results from operational and reference models.

2. Description of the Related Art

With the increasing penetration of processor-based systems into every facet of human activity, demands have increased on the processor and application-specific integrated circuit (ASIC) development and production community to produce systems that are free from design flaws. Circuit products, including microprocessors, digital signal and other special-purpose processors, and ASICs, have become involved in the performance of a vast array of critical functions, and the involvement of microprocessors in the important tasks of daily life has heightened the expectation of error-free and flaw-free design. Whether the impact of errors in design would be measured in human lives or in mere dollars and cents, consumers of circuit products have lost tolerance for results polluted by design errors. Consumers will not tolerate, by way of example, miscalculations on the floor of the stock exchange, in the medical devices that support human life, or in the computers that control their automobiles. All of these activities represent areas where the need for reliable circuit results has risen to a mission-critical concern.

In response to the increasing need for reliable, error-free designs, the processor and ASIC design and development community has developed rigorous, if incredibly expensive, methods for testing and verification. Simulation has been a traditional method for verifying such complex designs as processor chips. Because the simulation time for a design grows, in the worst case, in relation to the number of logic elements, simulation and verification of complex systems is one of the most time-consuming computing tasks today. It is therefore important to use simulation cycles effectively, with the aim that few bugs escape and development time is reduced.

Traditionally, floating point units (FPUs) of processors are validated by simulation, often using targeted techniques such as specialized testcase generators. While such approaches are efficient at exposing many bugs, they are based on incomplete methods, which cannot achieve full coverage, (i.e., evaluation of all operand combinations over all rounding modes and exception states). To compound the coverage problem, designs face shorter time-to-market (hence less verification time) from generation to generation, require higher clock speeds and thus a larger degree of pipelining, and acquire additional features such as clock gating for low-power. Formal and semiformal verification techniques constitute an increasingly prevalent mechanism by which to attempt to close the coverage gap imposed by simulation. For example, numerous approaches have proposed the use of a combination of automatic methods and manual theorem-proving techniques to yield complete proofs of correctness of FPUs.

There are three building blocks in the FPU that are major hurdles for the formal algorithms: namely, the multiplier, the alignment shifter that aligns the addend to the product, and the normalization shifter that eliminates leading zeros in the intermediate result before rounding. In testing, verification of each of these building blocks leads to run-time explosion of the symbolic models of the processor, and memory-explosion of binary decision diagrams representing the processor's symbolic logic.

What is needed is a more efficient method for verifying floating-point units, in particular, and more generally for verifying a digital design utilizing a simulation model.

SUMMARY OF THE INVENTION

A method of verifying a digital design is disclosed. The method comprises generating a reference model for a first digital design and creating an operational model for a second digital design, wherein the first digital design and the second digital design are intended to have a same logical function. A plurality of testcase types are then created by constraining one or more internal signals, and one or more test scripts representing the plurality of testcase types are produced. The method also includes verifying the second digital design with a testing simulation program by comparing results of the test scripts from the operational model and the reference model.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed descriptions of an illustrative embodiment when read in conjunction with the accompanying drawings, wherein:

DETAILED DESCRIPTION OF THE PREFERRED EMBODIMENT

Figure 1:
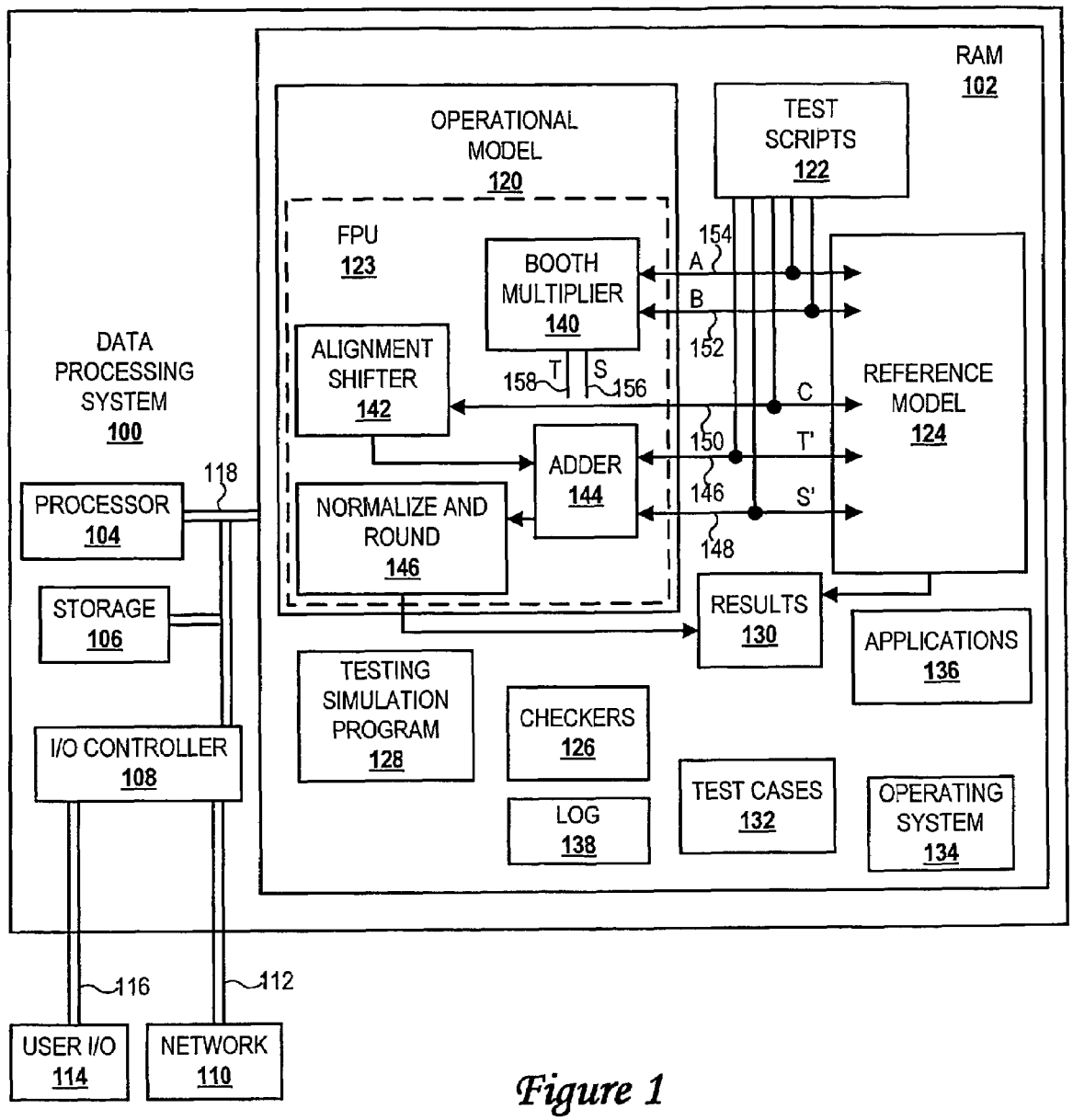
FIG. 1 is a block diagram of a data processing system equipped with a hardware design simulation and testing system in accordance with a preferred embodiment of the present invention.

With reference now to figures and in particular with reference to FIG. 1, there is depicted a block diagram of a data processing system equipped with a hardware simulation and testing system, in accordance with a preferred embodiment of the present invention. Data processing system 100 contains a processing storage unit (e.g., RAM 102) and a processor 104. Data processing system 100 also includes non-volatile storage 106 such as a hard disk drive or other direct access storage device. An Input/Output (I/O) controller 108 provides connectivity to a network 110 through a wired or wireless link, such as a network cable 112. I/O controller 108 also connects to user I/O devices 114 such as a keyboard, a mouse, a display device, a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention. These include: an operational model 120, test scripts 122, reference model 124, checkers 126, testing simulation program 128, results 130, log 138, test cases 132, operating system 134 and other applications 136. Operational model 120 includes representations of a booth multiplier 140, alignment shifter 142, adder 144 and normalize-and-round unit 146. Test scripts 122 contain input signals, S' 148, T' 146, C 150, B 152 and A 154.

Operational model 120 contains instructions for modeling specifications of a system topology and system properties of a simulated circuit or system, e.g., a floating-point unit. Test cases 132 contain descriptions of simulated inputs to the simulated circuit described in operational model 120 and reference model 124. The inputs to the simulated circuit or system described in operational model 120 and reference model 124 are detailed as instructions in test scripts 122. Testing simulation program 128 includes a computer program product, stored in RAM 102 and executed on processor 104, which provides a series of tools for behavior-simulation testing. Generally speaking, testing simulation program 128 contains rule-based instructions for computing or calculating the behavior of logically or mathematically modeled items of hardware and software, described in operational model 120 and reference model 124, in response to input stimuli, which are defined in the instructions contained within test scripts 122. Testing simulation program 128 uses the series of rules contained in its own instructions, in conjunction with reference model 124 and operational model 120, to compute or calculate the response of the simulated hardware modeled in operational model 120 and reference model 124 to external and internal stimuli described in test cases 132.

Depending on what items of hardware are modeled, operational model 120 and reference model 124 may model the designs of many different kinds of hardware, but preferably provide software representations of microprocessors and application specific integrated circuits (ASICs) or individual subcircuits such as a floating point unit (FPU) 123.

Testing simulation program 128 generates a file of results 130 containing output result trace files, which represent the response of the simulated hardware modeled in operational model 120 and reference model 124 to external and internal stimuli described in test case 132, and data for sorting the output result trace files by associated input simple events and time fields associated with the input simple events.

Testing simulation program 128 checks results 130 by comparing the output values from operational model 120 and reference model 124. The interactions of the simulated hardware described by operational model 120 and reference model 124 with external and internal stimuli described in test case 132 are verified by comparing output result trace files stored in results 130. Testing simulation program 128 then records the output of these comparisons to log 138. Testing simulation program 128 may also report the contents of log 138 or the status selected indicators of the status of operational model 120 to user I/O 114. Additionally, all or part of an operational model 120, test scripts 122, reference model 124, checkers 126, testing simulation program 128, results 130, log 138, test cases 132, operating system 134 and other applications 136 may, at times, be stored in storage 106 or in RAM 102.

Operational model 120, test scripts 122, reference model 124, checkers 126, testing simulation program 128, results 130, a log 138, test cases 132, and other applications 136 interface with processor 104, RAM 102, I/O control 108, and storage 106 through operating system 134. One skilled in the data processing arts will quickly realize that additional components of data processing system 100 may be added to or substituted for those shown without departing from the scope of the present invention.

Processor 104 executes instructions from programs, often stored in RAM 102, in the course of performing the present invention. In a preferred embodiment of the present invention, processor 104 executes testing simulation program 128, operating system 134 and other applications 136, though, at times, not all of executes testing simulation program 128, operating system 134 and other applications 136 will run simultaneously. Testing simulation program 128 simulates the operation of operational model 120 and reference model 124 in response to receipt of values for signals S' 148, T' 146, C 150, B 152 and A 154 from test scripts 122, representing test cases 132, and records results 130, comparisons of which are recorded in log 138. The present invention provides a method for testing digital designs, specifically implemented with respect to an operational model 120 containing FPU 123. FPU 123, which is under verification, supports the double-precision fused-multiply-add (FMA) instruction and its derivatives.

In prior-art testing of an FPU, operational model 120 and reference model 124 would both receive values of C 150, B 152 and A 154. In the current embodiment, operational model 120 and reference model 124 receive values of C 150, B 152 and A 154 as well as values of S' 148 and T' 146, which replace internal signals S 156 and T 158, respectively. The use of pre-selected values for S' 148 and T' 146 as replacements S 156 and T 158 creates a series of test cases 132, as described below, which improves the efficiency of testing of operational model 120.

In one embodiment, reference model 124 is written in an HDL, such as VHDL and, as with operational model 120, is transformed into a netlist using a standard VHDL compiler, which may be included as part of testing simulation program 128 or may operate as one of applications 136. Reference model 124 is an interpretation of a standard developed by the Institute for Electrical and Electronics Engineers for floating-point arithmetic units (I.E.E.E. #754). The primary goal of reference model 124 is simplicity. For the sake of simplicity, the example described with respect to reference model 124 treats all denormal operands as zero. Reference model 124 is a concise specification, not prone to the introduction of bugs via the high-performance design and micro-architecture features that complicate the operational model 120. This simplicity comes at the cost of increased gate count, lack of adherence to multi-GHz design constraints such as limitations on combinational logic levels between state elements, and greater structural dissimilarity with the operational model 120, which precludes redundancy removal techniques from significantly simplifying the verification problem. The penalty of the former two points is obviated by the fact that reference model 124 is not intended for fabrication, and the latter is inevitable with a portable reference model and addressed by the overall methodology of the present invention.

Two principles, used in the design of reference model 124, help to achieve this simplicity. First, reference model 124 is algorithmically simple, as detailed below. This simplicity implies a removal of features such as leading-zero anticipators, complex end-around-carry logic, power-saving schemes, etc. Second, high-level HDL constructs, including blocks such as adders, shifters, and leading-zero counters, which are often designed at the gate-level in order to match the high-performance circuit structure and facilitate combinational equivalence checking between the two representations are removed. Use of reference model 124 allows testing simulation program 128 to independently evaluate the operational model 120 and reference model 124 and compare stored results 130. There is, therefore, no need to establish corresponding pipeline stages between operational model 120 and reference model 124.

In one exemplary implementation, the core of the FPU within reference model 124 may be implemented as a construct, created by compiling approximately 300 lines of VHDL; the handling of special cases on the FPU, such as operations on NaN and infinity, requires another 150 lines of trivial if-then constructs. In total, the FPU within reference model 124 is approximately 450 lines of VHDL, versus approximately 15,000 for operational model 120. Reference model 124 is required to compute A*B+C for three operands A, B, and C. Other operations, such as addition or multiplication, can be derived from operations of floating point Multiply-Add unit such as reference model 124. To explain the operation of an FPU within reference model 124, Let $s_a$ denote the sign, $e_a$ the unbiased exponent, and $f_a$ the significand including the implicit one of the operand A. Similarly, let $s_b$ denote the sign, $e_b$ the unbiased exponent, and $f_b$ the significand including the implicit one of the operand B, and let $s_c$ denote the sign, $e_c$ the unbiased exponent, and $f_c$ the significand including the implicit one of the operand C. Define $s_p = s_a$ xor $s_b$, $e_p = e_a + e_b$, and $f_p = f_a * f_b$. The FMA operation can be rewritten as $$A*B+C = [((-1)^{s_a} * 2^{e_a} * f_a] * [(-1)^{s_b} * 2^{e_b} * f_b] + [(-1)^{s_c} * 2^{e_c} * f_c] = [(-1)^{s_p} * 2^{e_p} * f_p].$$

Because the operand significands have 1 bit before and 52 bits behind the binary point, $f_{prod}$ has 2 bits before and 104 bits behind the binary point, and thus, a total of 106 bits. Let $\delta := e_{prod} - e_c$ denote the difference of the product exponent and the addend exponent. The definition of $\delta$ will lead to four distinct ranges of $\delta$, which are discussed below with respect FIG. 2A through FIG. 2D. For simplicity, reference model 124 is implemented with separate VHDL code inside a case-statement for the following four cases. In a real FPU, one would attempt to reuse as much logic as possible to handle these cases, decreasing circuit size but increasing implementation complexity.

Figure 2A:
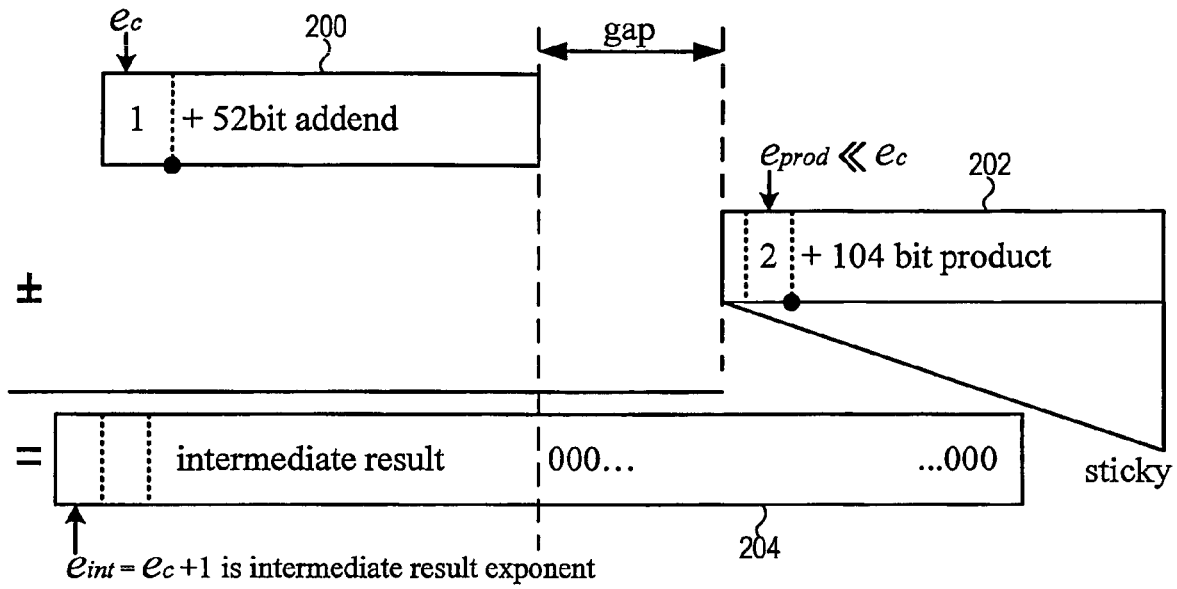
FIGS. 2A-2D depict a bit level representation of a computation on an FMA FPU in a series of test cases in accordance with a preferred embodiment of the present invention.

Turning now to FIG. 2A, a bit level representation of a computation on an FMA FPU in a far-out left shift case is depicted. In the case depicted in FIG. 2A, $\delta \leq -55$. Addend 200 is much larger than product 202, and hence addend 200 lies completely to the left of product 202. Addend 200 is thus used as an intermediate result 204, and the product 202 is reduced to a single sticky bit used for rounding. The $\delta \leq -55$ boundary is derived as follows: addend 200 has 52 bits behind the binary point, while $\delta$ reflects the distance between the most-significant bit of addend 200 and the first bit left of the binary point of product 202. Hence, if this distance is 52, i.e. if $\delta = -52$, then the two bits left of the binary point of product 202 are logically aligned below the two least significant bits of addend 200. At a distance of 54, product 202 lies directly behind addend 200, but then the most significant bit of product 202 would be the guard bit for rounding. At a distance of greater or equal to 55 ($\delta \leq -55$), product 202 is completely reduced to a sticky-bit for rounding. One skilled in the art will quickly realize that boundaries for the cases depicted in FIGS. 2b-2d can be derived similarly.

Figure 2B:
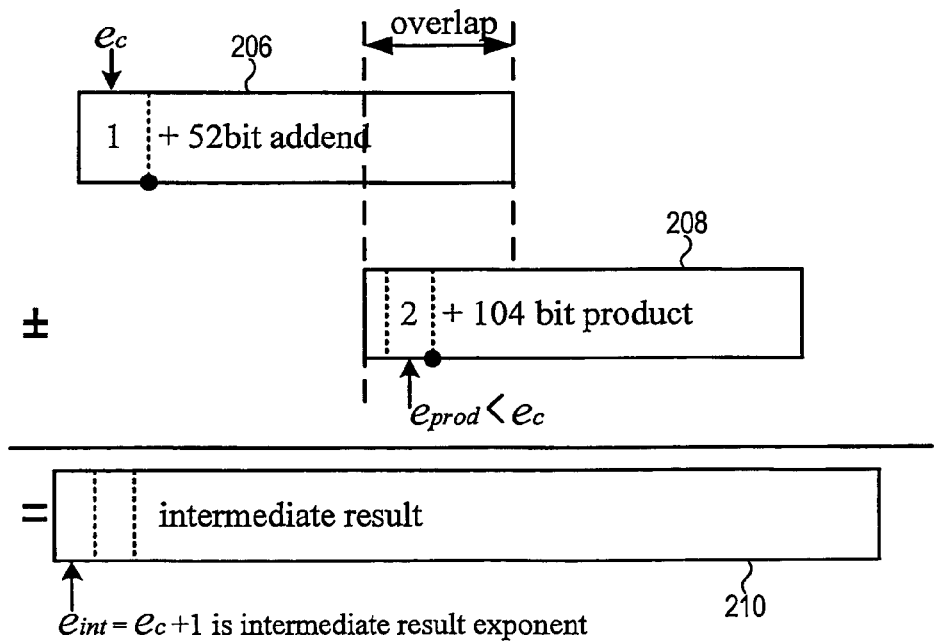

With reference now to FIG. 2B, a bit-level representation of a computation on an FMA FPU in a overlap-left shift case is illustrated. In the case depicted in FIG. 2B, $\delta$ is within the set of $\{-54, \ldots, 1\}$. Addend 206 is larger than the product 208, but the product 208 vector overlaps with the right end of the addend 206 vector. Intermediate result 210 is computed by adding/subtracting the properly aligned product 208 to addend 206, depending on the signs and opcode used to order the computaton. Aligning product 208 requires shifting product 208 by an amount directly depending upon $\delta$.

Figure 2C:
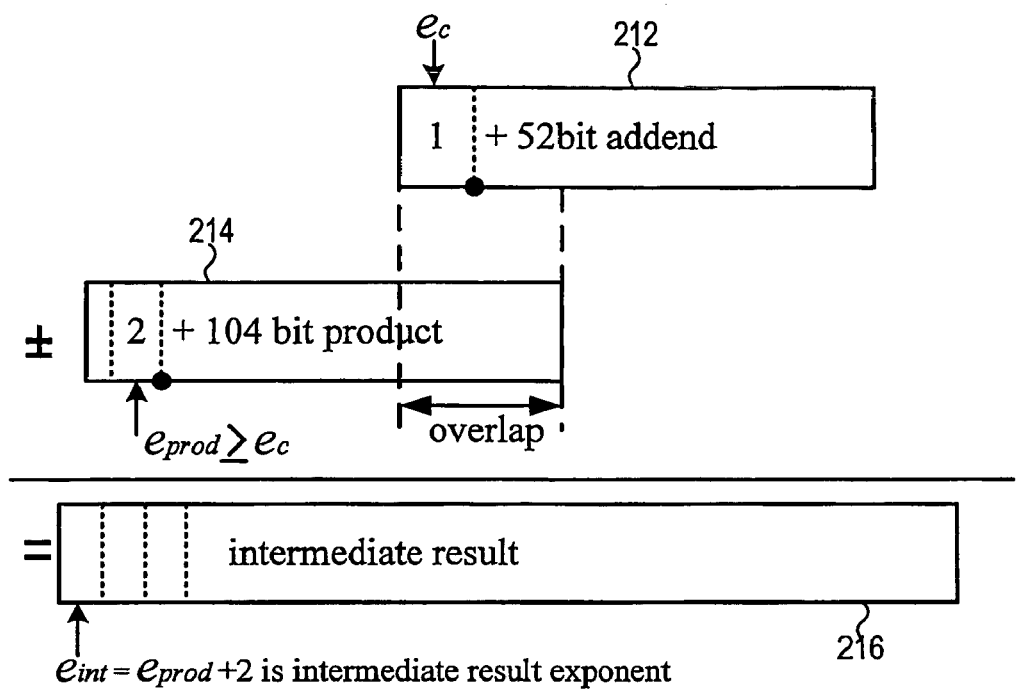

Turning now to FIG. 2C, a bit-level representation of a computation on an FMA FPU in a overlap-right shift case is depicted. In the case depicted in FIG. 2C, $\delta$ is within the set of $\{0, \ldots, 105\}$. The computation depicted in FIG. 2C behaves in a manner similar to the previous case depicted with respect to FIG. 2B. With respect to FIG. 2C, however, addend 212 overlaps with the right side of the product 214. Intermediate result 216 is computed by adding/subtracting the properly aligned addend 212 to the product 214, which involves shifting the addend 212 by an amount directly depending upon $\delta$.

Figure 2D:
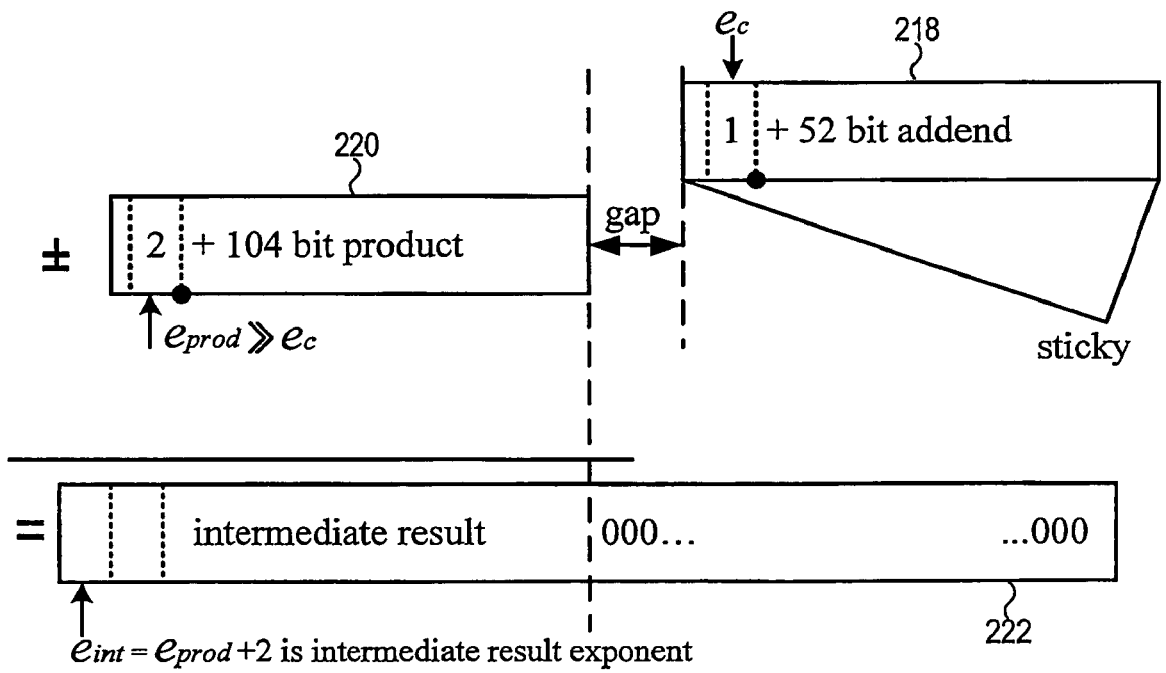

With reference now to FIG. 2D, a bit-level representation of a computation on an FMA FPU in a far-out right shift case is illustrated. In the case depicted in FIG. 2D, $\delta \geq 106$. Addend 218 is much smaller than product 220, and hence addend 218 lies completely to the right of product 220. In this case, product 220 is used as intermediate result 222, and the addend 218 is reduced to a sticky bit.

The maximum width for intermediate result 204, intermediate result 210, intermediate result 216 and intermediate result 222 is 161 bits, accounting for 1 carry-out bit, 53 bits of the addend, 106 bits of product, and one guard bit. In all cases an intermediate result of this width is computed; if the overlap is small (or a far-out case happens), the intermediate result is padded with 0's. The intermediate exponent $e_{int}$ is the weight of the most signicant bit.

Figure 3:
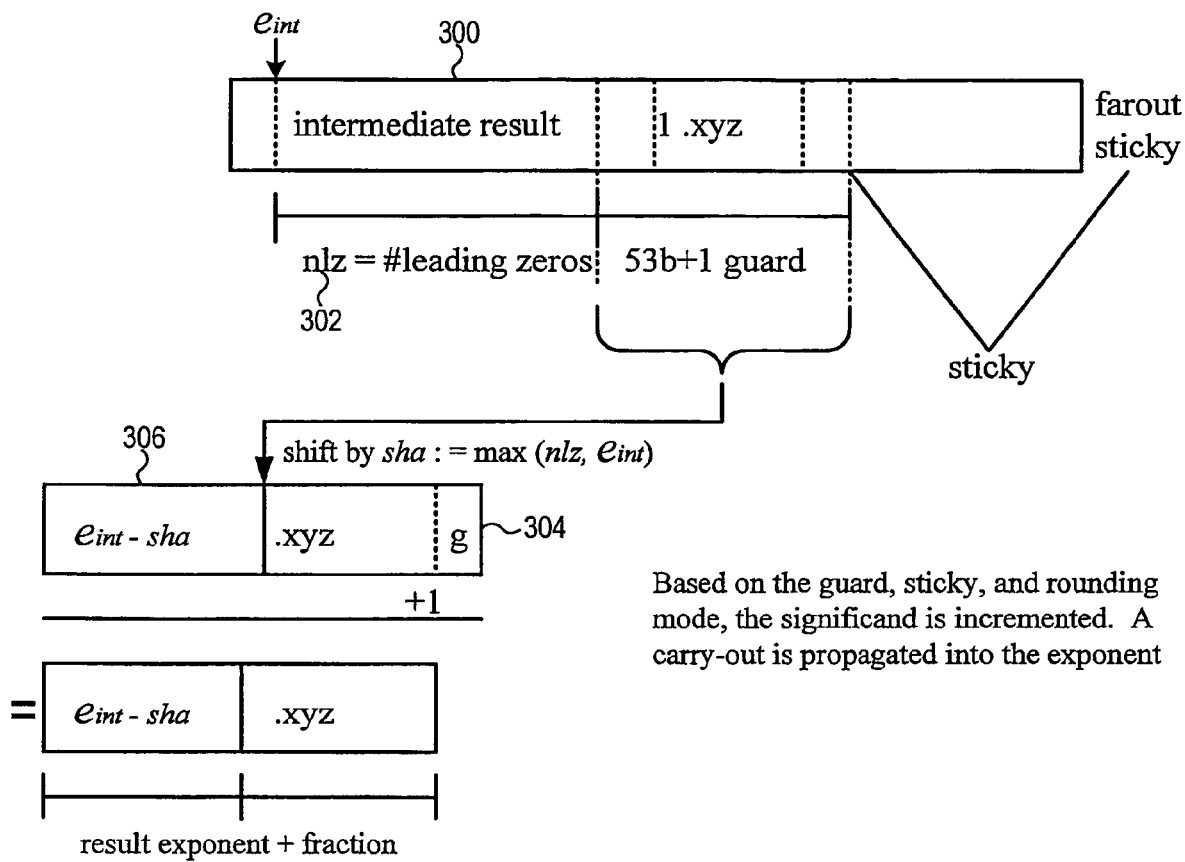
FIG. 3 depicts data structures reflecting the operation of a reference FPU rounder, in accordance with a preferred embodiment of the present invention.

Turning now to FIG. 3, a bit-level representation of a computation on a reference model FPUs rounder is depicted. Depending on which of the cases depicted in FIG. 2A-2D accurately depicts an operation, one of the set of intermediate result 204, intermediate result 210, intermediate result 216 and intermediate result 222 is passed from the multiplier of reference model 124 to the rounder of reference model 124, thereby modeling the passing of T 158 and S 156 from booth multiplier 140 to rounder 146. The rounder of reference model 124 counts the number of leading zeros, nlz 302 of intermediate result 300. Counting of leading zeroes nlz 302 is necessary because, in the overlap cases described above with respect to FIG. 2b and FIG. 2c, the addend and the product may cancel out some positions.

Next, intermediate result 300 is shifted to the left by nlz 302 places to achieve second intermediate result 304, and intermediate exponent 306 is adjusted by subtracting nlz 302 from intermediate exponent 306. However, the shift-amount is bounded if necessary to prevent intermediate exponent 306 from becoming negative. Note that a denormal result may be generated here due to such partial normalization. Finally, second intermediate result 304 is rounded according to the rounding mode and the bits behind the significand 308, as well as any sticky bits generated in the two far-out cases. The rounder of reference model 124 also produces flags such as over_flow, under_flow, and inexact, which are readily computed from the exponent and the rounding decision, but are not shown.

An FPU's alignment and normalization shifters, the operation of which is described above with respect to FIG. 3, are inherently difficult for both binary decision diagram (BDD)-based algorithms and satisfiability (SAT)-based algorithms, due to shifts of variable values by variable amounts. In order to make the verification task feasible, the present invention divides the overall problem into subcases. The method of case-splitting in the present invention fixes shift amounts of shifters in both reference model 124 and operational model 120 to a constant in each case, rendering the shifters amenable to BDD-based analysis and SAT-based analysis within each case. To ensure complete coverage, all possible combinations of shift amounts are included in at least one case.

In Far-out cases, as described with respect to FIG. 2A (and FIG. 2D), intermediate result 204 represents product 202, and addend 200 is reduced to a single sticky bit, or vice versa. This case does not need to be sub-divided further. In overlap cases, as described with respect to FIG. 2b (or FIG. 2c), addend 206 and product 208 overlap, i.e., $\delta=\{-54 \ldots, 105\}$. The alignment-shift amount is determined by $\delta$. As described above, this case is divided into a subcase for each of the 160 different $\delta$ values to trivialize the alignment shifter. These 160 cases belong to two classes. In the first class, if $\delta \neq \{-2, -1, 0, 1\}$, then the most significant bits of addend 206 and product 208 are at least two bit-positions apart. In this case, no massive cancellation can occur. The small normalization shift amounts between 0 and 2 due to carry-outs or borrows-out during the addition can be handled by the formal algorithms without further splitting.

In the second class, if $\delta=\{-2, -1, 0, 1\}$, then product 208 and addend 206 may cancel out leading bits when performing effective subtraction. In this case the normalization shift amount is determined by the leading-zero counter in the reference model 124 and by a leading-zero-anticipator in the operational model 120. Both methods normalize at most to the extent that the exponent does not drop below 0, as illustrated with respect to FIG. 3. In these cases a normalization shifter can perform shifts by arbitrary amounts, and testing simulation program will sub-divide these four values into sub-cases for every normalization-shift-amount, i.e., into 107 sub-cases.

The method of the present invention therefore provides for one far-out case, 156 non-cancellation overlap cases, and 4*106 cancellation overlap cases, totaling 581 cases, which are independently verified in the method of the present invention. Note that these cases naturally reflect the way in which FPUs generate results, from simple reference models to multi-GHz implementations using any variety of design and micro-architectural techniques. The present invention is thus applicable to many designs. While the method of the present invention has been described with respect to numerical results reflecting a specific design of an FPU, the method of the present invention has been shown to be portable to a large number of designs, for which adjustments in many of the discussed numerical boundaries will be apparent to a person skilled in the relevant art. As an example, the number of cases discussed above reflects the exemplary embodiment of an FPU considered herein. One skilled in the relevant art will quickly realize that the number of cancellation overlap cases will vary for other designs, and that the existence of 581 cases in the present embodiment specifically reflects a decision to treat denormal operands as zero with respect to the FPU under consideration.

Case-splitting is achieved by constraining certain signals in the reference model 124 and operational model 120 corresponding to the sub-case under consideration. Formal tools use the constraints to define a care-set, and may simplify their processing during the verification with respect to the defined care-set; non-formal frameworks may ignore the constraints. The distinction between far-out and overlap, and between the different $\delta$ values, is defined by a constraint on the operand exponents. Specifically, testing simulation program 178 will define a constraint $C_\delta := (e_a + e_b = e_c + \delta)$ for every $\delta$-case. The constraint for the far-out cases is the respective inequality over the operand exponents.

Regarding the additional constraints for the cancellation cases, the normalization shift amount depends on the number of leading zeros of the intermediate result and the intermediate exponent 306. Hence, it is difficult to define these constraints directly upon the operands while still ensuring that the case-split is complete and still sufficient to trivialize the normalization shifter. For this reason, the normalization shift constraint is defined directly on the shift-amount signal sha of reference model 124, represented in test scripts 122 by S' 148, T', and a constraint $C_{sha} := $ (sha=X) is defined for all 106 possible shift-amounts, plus one additional case $C_{sha/ret} := $ (sha=>106) to cover the remaining values. The case defines an empty care-set, hence this case is trivially discharged; it is checked only to guarantee completeness. The disjunction of all the cases is easily provable as a tautology, guaranteeing completeness of the methodology of the present invention.

Note that the logic driving the sha signal in reference model 124 is well understood by those skilled in the art. The number of leading zeros in the intermediate result 300 is obtained from a 161-bit addition of product 208 and addend 206. The addition itself is based on the (constrained) alignment shifts of the product and the addend. Despite the complexity of the logic driving the constraint, this constraint alone suffices to bound BDD size both for the reference model 124 and operational model 120 computations without any explicit constraint on operational model 120, a significant observation that demonstrates the benefit of using constraints as a mechanism for case-splitting. The sha signal is a function of the operand and opcode values represented as a BDD. A constraint on sha is therefore effectively a constraint on the operand and opcode; although the BDD-minimization algorithms are heuristic, they are powerful enough to automatically carry over this constraint from the reference model 124 to the operational model 120, effectively constraining operational model 120's shift amount. This constraint is non-trivial, considering that the shift-amount of operational model 120 is obtained from a completely dissimilar piece of logic, namely a limited leading-zero anticipator (LZA) working in parallel with the adder. Note that the shift-amount signal in the operational model 120 may even differ in value from sha in the reference model 124, e.g., offset by a constant preshift, or simply offset by one due to the possible shift-amount anticipation error inherent in the LZA structure.

Figure 4:
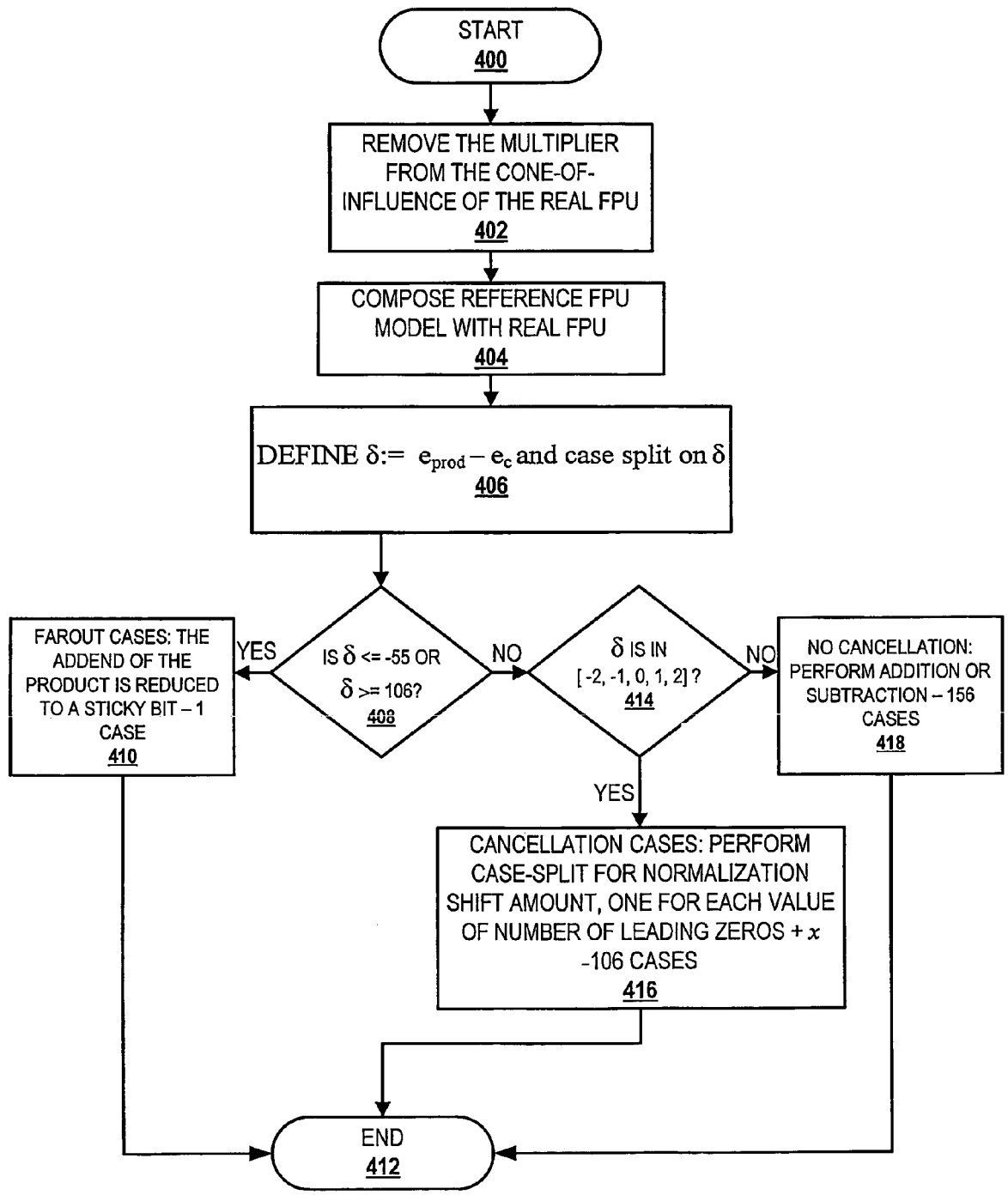
FIG. 4 is a high-level logical flowchart of an exemplary process for generating test cases in accordance with a preferred embodiment of the present invention.

With reference now to FIG. 4, a high-level logical flow-chart of an exemplary process for generating test cases in accordance with a preferred embodiment of the present invention is depicted. The process starts at step 400. The process next moves to step 402, which illustrates testing simulation program 128 removing booth multiplier 140 from the cone of influence of operational model 120 and reference model 124 by severing signals S 156 and T 158, which normally provide internal signaling from booth multiplier 140 to adder 144. The process then proceeds to step 402, which depicts testing simulation program 128 composing floating point unit of reference model 124 with floating point unit 123 of operational model 120 by providing to adder 144 constrained internal signals S'148 and T'146.

The process next moves to step 406, which depicts testing simulation program 128 defining $\delta := e_{prod} - e_c$. The process then moves to step 408, which depicts testing program 128 determining whether variable $\delta$ is less than or equal to $-55$ is greater than or equal to 106. If the $\delta$ variable is less than $-55$ or greater than or equal to 106, the process then moves to step 410, which depicts testing program 128 generating far-out cases by the addend or the product being reduced to a sticky bit. The process then moves to step 412 where it ends.

If the $\delta$ variable is not less than or equal to $-55$ or greater than or equal to 106, then the process moves to step 414. In step 414, testing simulation program 128 determines if $\delta$ is in the set of $-2, -1, 0, 1,$ and $2$. If $\delta$ is in the set of $-2, -1, 0, 1$ and $2$, then the process moves to step 416. At step 416, testing simulation program 128 creates cancellation cases by performing case-splitting for a normalization shift amount, one unit for each value of leading zeros, creating 106 test cases in all. The process then ends at step 412, as described above.

Returning to step 414, if $\delta$ is not in the set of $-2, -1, 0, 1$ and $2$, then the process proceeds to step 418. At step 418, testing simulation program 128 creates no cancellation cases, and addition or subtraction is performed to create 156 test cases. The process then moves to step 412 where it ends.

Figure 5:
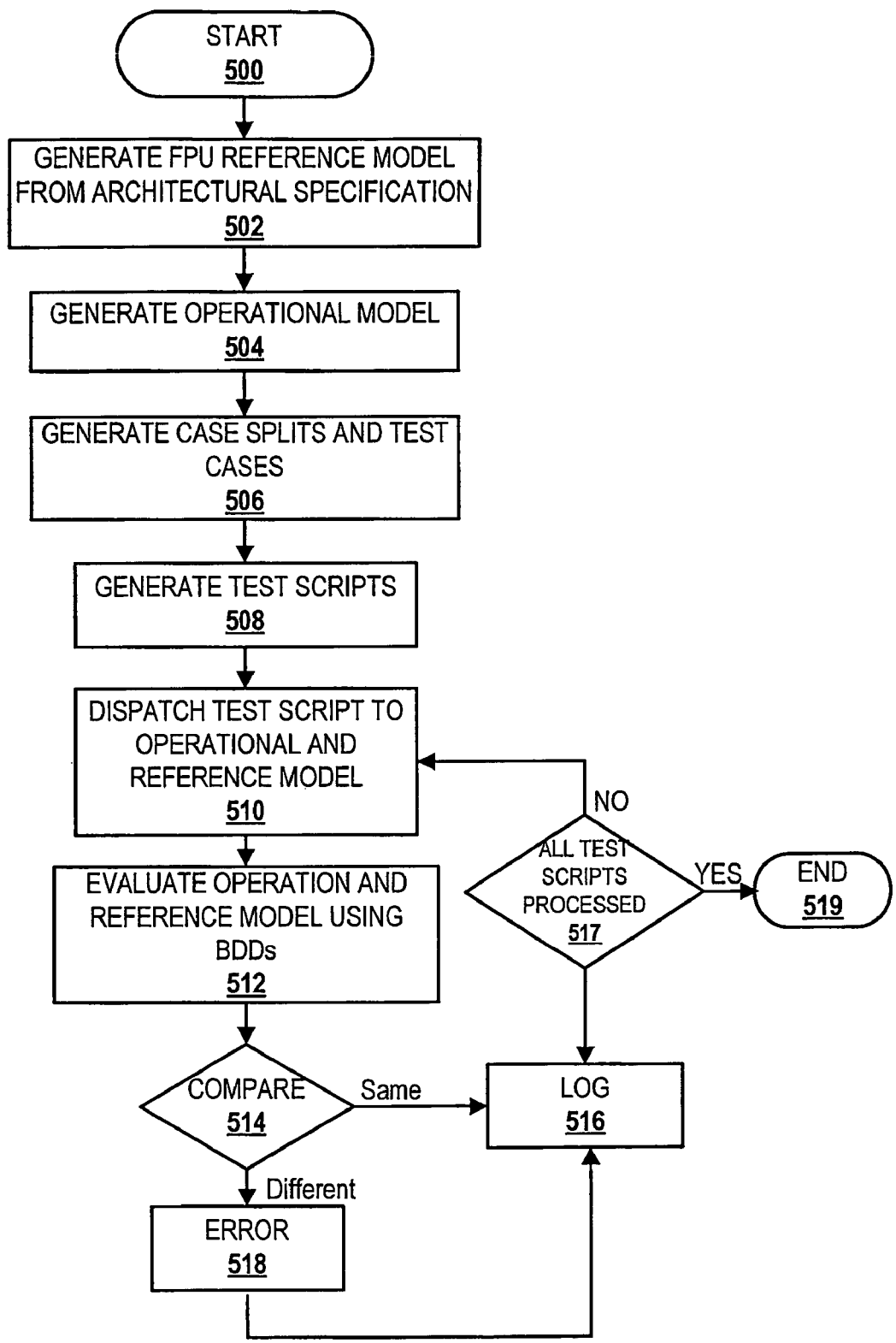
FIG. 5 is a high-level logical flowchart of an exemplary process for verification of a fused-multiply-add floating point unit via constrained internal signals.

Turning now to FIG. 5, a high level logical flowchart of an exemplary process for verification of fused-multiply-add at floating point units via constrained internal signals is depicted. The process starts at step 500. The process next proceeds to step 502, which depicts testing simulation program 128 generating FPU reference model 124 from an architectural specification. The process then moves to step 504, which depicts testing simulation program generating an operational model 120. The process then proceeds to step 506. Step 506 illustrates testing simulation program generating case splits and test cases 132, as is detailed with respect to FIG. 4 above. The process then moves to step 508, which depicts testing simulation program 128 generating test scripts 122 by transforming the variable descriptions contained in test cases 132 into instructions for use by testing simulation program 128 with reference model 124 and operational model 120.

The process next proceeds to step 510. At step 510, testing simulation program dispatches signals from test scripts 122 to operational model 120 and reference model 124. Next, the process moves to step 512, which depicts testing simulation program 128 evaluating a binary decision diagram for operational model 120 and reference model 124 responding to signals received from test scripts 122 and recording results 130. The process then moves to step 514, which depicts testing simulation program 128 comparing results between reference model 124 and operational model 120. If, in step 524, results 130 received from operational model 120 and reference model 124 are the same, then the process moves to step 516, which depicts testing simulation program 126 recording the comparison between the results 130 from operational model 120 and referenced model 124 in log 138. The process next moves to step 517, which illustrates testing simulation program determining if all test scripts 122 have been dispatched to operational model 120 and reference model 124, then the process ends at Step 519. If less than all test scripts 122 have been dispatched to operational model 120 and reference model 124, then the process then returns to step 510, which is described above.

Returning to step 514, if testing simulation program 128 determines that results 130 received from reference model 124 and operational model 120 are different, then the process next moves to step 518. At step 518, testing simulation program propagates an error message, which is recorded in log 138, as shown at step 516. Thereafter, the process returns to step 517, which is described above.

The present invention provides several advantages over prior art solutions for testing FPU designs. The present invention provides an an efficient, fully-automated methodology for the verification of fused-multiply-add FPUs. This methodology targets exhaustive verification of the complex circuits, such as FPUs, focusing on the arithmetic correctness of a single arbitrary instruction. The presented approach compares an operational model of the design against a simple reference model derived from the design's architectural specification, which may include all aspects of the IEEE specification such as denormal operands and exceptions. The method of the present invention is portable to simulation, emulation, semi-formal, and formal verification frameworks; no customized toolset is necessary. The case-splitting of the present invention is defined in terms of the internal signals within a reference model and an operational model, ensuring that this overall methodology, as well as the reference model itself, is easily portable to various implementations. Coupled with the use of a Boolean equivalence checker, this overall approach enables a seamless proof of datapath correctness from the transistor schematic all the way up to the architecture-level specification. Finally, while method of the present invention has been described with respect to numerical results reflecting a specific design of an FPU, the method of the present invention has been shown to be portable to a large number of designs, for which adjustments in many of the discussed numerical boundaries will be apparent to a person skilled in the relevant art.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A method of verifying a digital design in a data processing system, said method comprising:
    generating a reference model for a first digital design;
    creating a operational model for a second digital design, wherein said first digital design and said second digital design are intended to have a same logical function;
    creating a plurality of testcase types by constraining one or more internal signals within said operational model, wherein said plurality of testcase types include a plurality of descriptions of simulated inputs to said reference model and said operational model and constraining one or more output signals from a simulated component within said second digital design;

producing one or more test scripts representing said plurality of testcase types;

verifying said second digital design with a testing simulation program by comparing results of said test scripts from said operational model and said reference model; and outputting a result of said comparing to a log in said data processing system.

2. The method of claim 1, wherein said step of creating a plurality of testcase types by constraining one or more internal signals further comprises constraining a normalization shift amount within a floating point unit.

3. The method of claim 1, wherein said step of creating a plurality of testcase types by constraining one or more internal signals further comprises constraining one or more input signals to a simulated component within a digital design.

4. The method of claim 1, wherein said step of creating a plurality of testcase types by constraining one or more internal signals further comprises constraining one or more input signals to a simulated component within a floating point unit.

5. The method of claim 1, wherein said step of creating a plurality of testcase types by constraining one or more internal signals further comprises replacing one or more internal signals within a floating point unit with one or more selected constants.

6. The method of claim 1, wherein said step of verifying said second digital design with a testing simulation program by comparing results of said test scripts from said operational model and said reference model further comprises calculating results of said reference model and said operational model using one or more selected constants representing output from a simulated component of said reference model.

* * * * *